United States Patent [19]
Brefka

[11] 3,950,603
[45] Apr. 13, 1976

[54] ENCLOSURE CASE FOR POTLESS IMMOBILIZATION OF CIRCUIT COMPONENTS

[75] Inventor: Paul C. Brefka, Southboro, Mass.

[73] Assignee: Analog Devices, Incorporated, Norwood, Mass.

[22] Filed: Jan. 23, 1975

[21] Appl. No.: 543,336

[52] U.S. Cl.............. 174/52 R; 174/50; 174/50.54; 220/4 B; 220/DIG. 25
[51] Int. Cl.² .......................................... H05K 5/00
[58] Field of Search....... 174/52 R, 52 PE, 50, 50.5, 174/50.54, 52 S; 317/101 R, 101 CB, 120, 101 DH, 101 D; 200/303; 222/DIG. 25, 4 B, 4 E

[56] References Cited
UNITED STATES PATENTS

| | | | |
|---|---|---|---|
| 2,144,523 | 1/1939 | Brown.................... | 220/DIG. 25 UX |
| 2,329,442 | 9/1943 | Popp...................... | 200/303 |
| 2,924,639 | 2/1960 | Zelt....................... | 174/50 X |
| 3,146,435 | 8/1964 | Kelly...................... | 174/52 R X |
| 3,307,077 | 2/1967 | Bernstein................. | 174/52 S X |
| 3,391,384 | 7/1968 | Hughes................... | 174/52 R X |
| 3,634,599 | 1/1972 | Kliewer................... | 174/52 R |
| 3,693,410 | 9/1972 | Robrecht et al............ | 220/4 B UX |
| 3,829,604 | 8/1974 | Tanaka et al.............. | 174/52 S |

*Primary Examiner*—Darrell L. Clay
*Attorney, Agent, or Firm*—Parmelee, Johnson & Bollinger

[57] ABSTRACT

An enclosed modular circuit component is immobilized against deleterious movement due to high impact, shock and vibration movement. A two-piece enclosure case for securely immobilizing a wide variety of readily available modular circuit components is easy to fabricate and utilize with the components. The enclosure case comprises two halves each of which has a top and a bottom, respectively, with two oppositely disposed side walls projecting therefrom. At least one half of the case has a ledge upon which the circuit component header, such as an element support board or a printed circuit board, may be supported. The other half of the case is then provided with means to urge the board against the ledge so that when the two halves are placed together the component is sandwiched between them in a secured immobile relationship. The component elements may be maintained spaced from contact with the enclosure interior surfaces. The side walls contain interlock means which cooperate with complementary interlock means on the respective top or bottom of the other half to form a tight fitting interlock engagement. The interlock is under tension since each half has only two opposite walls which can thus be flexed. In this manner, the entire assembly unit has a continuous interlock around its periphery. Openings for the board lead pins are provided.

9 Claims, 8 Drawing Figures

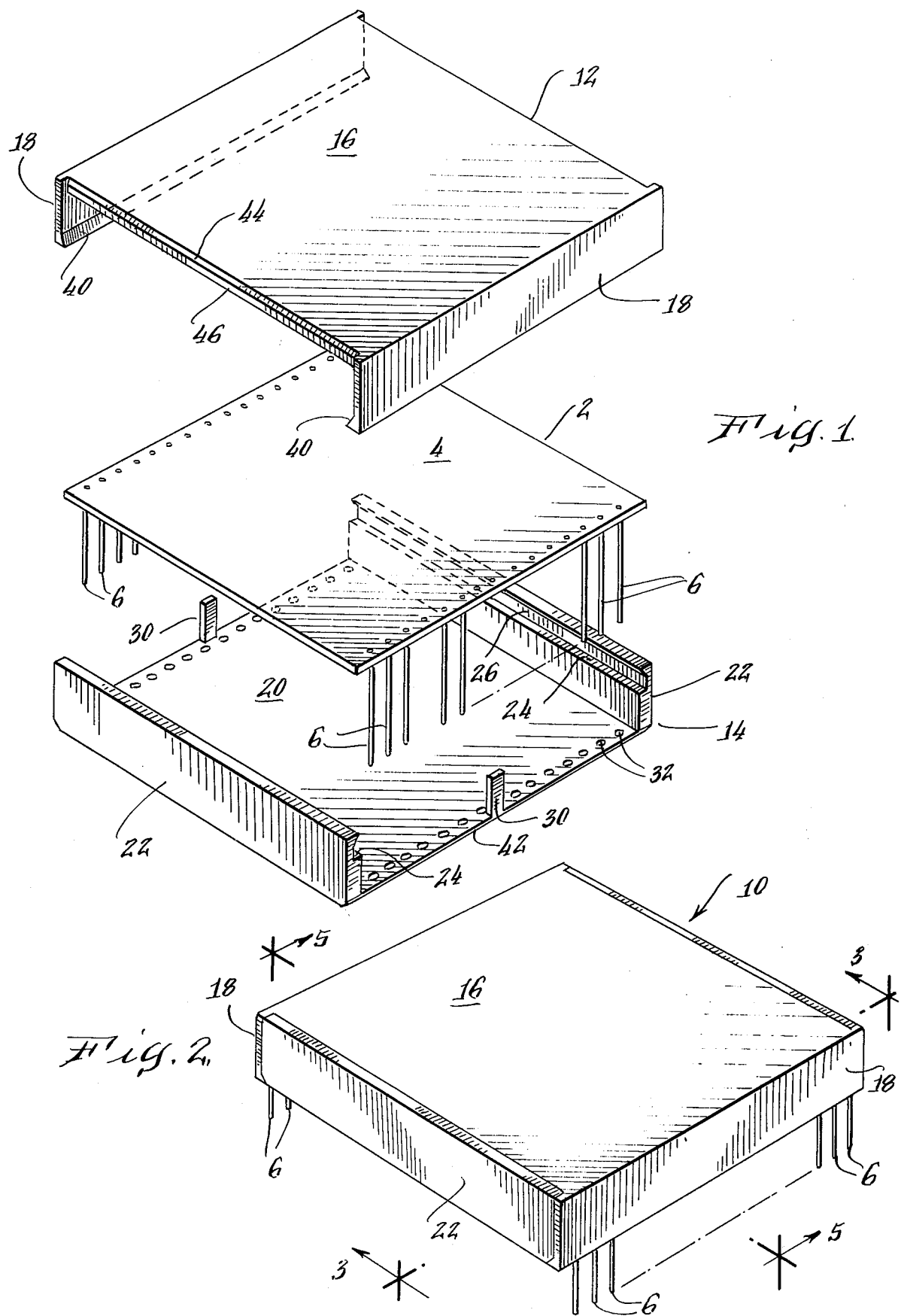

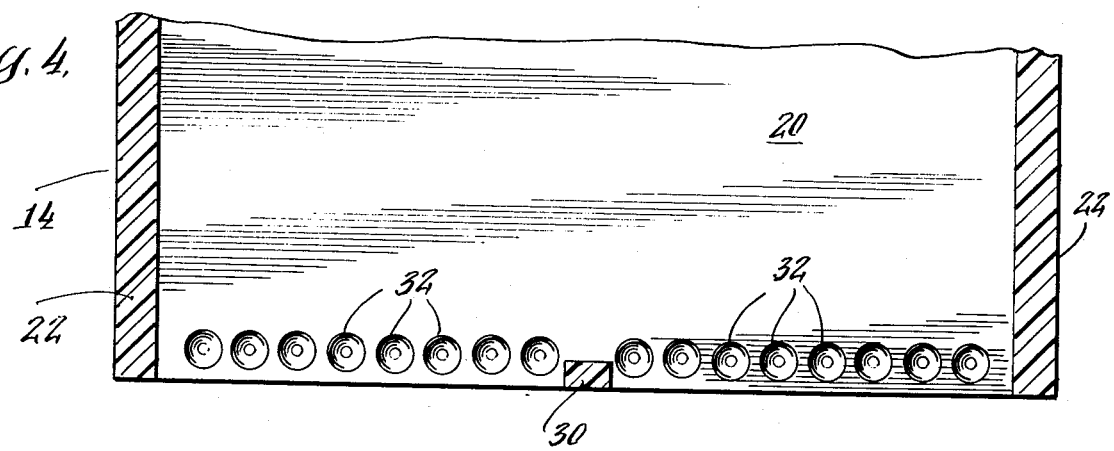
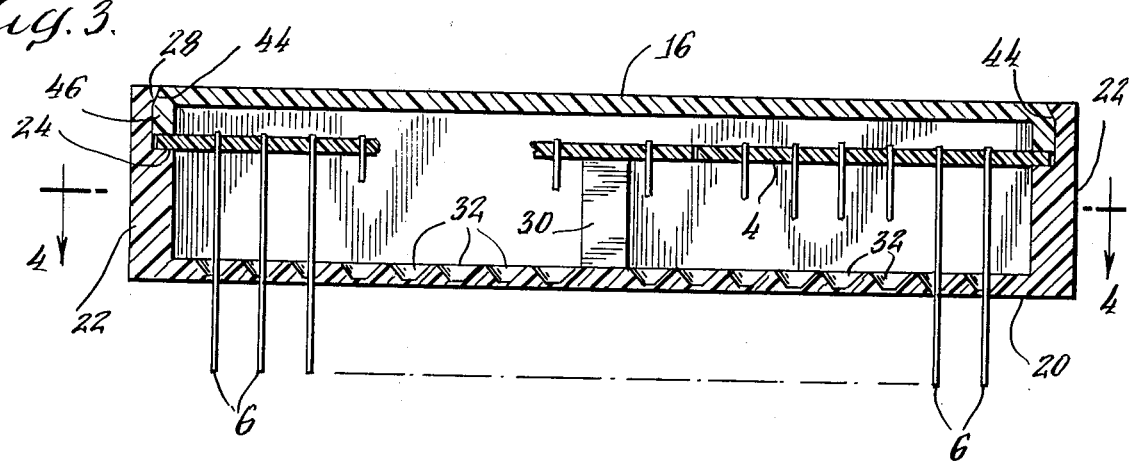
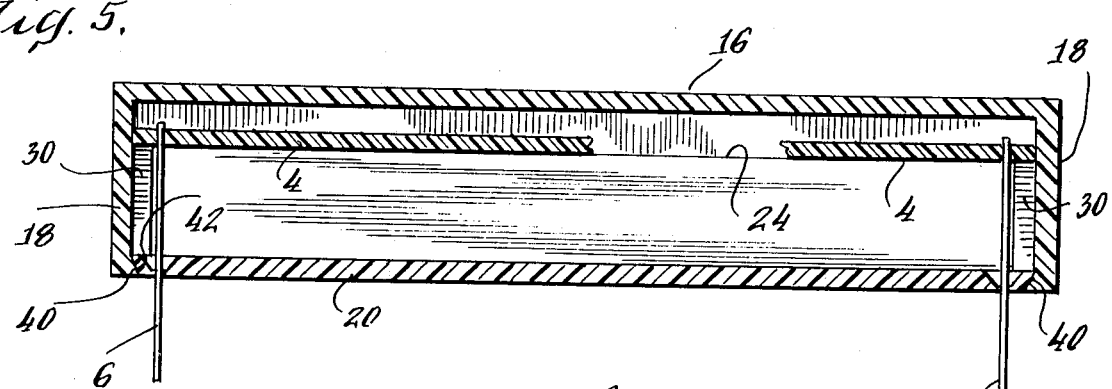
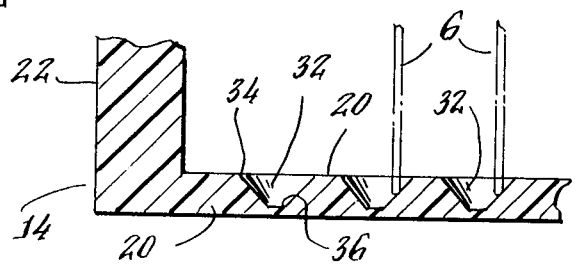

ENCLOSURE CASE FOR POTLESS IMMOBILIZATION OF CIRCUIT COMPONENTS

BACKGROUND OF THE INVENTION

This invention relates to the immobilization of modular circuit components to reduce potentially deleterious effects of sudden movements, such as shock and vibration, under handling and when in use in a circuit. In particular, this invention is directed to a case or box for enclosing a modular circuit component in comparatively immobile and secure position without the need for surrounding the component with potting material and to the component so enclosed.

Modular circuit components performing various functions have found increasing application in areas, such as aerospace and military uses, which require that they withstand high impact, shock and vibration and similar potentially harmful operating characteristics. To aid in meeting high shock, impact and vibration specifications, modular circuit components have been encapsulated with potting material within an enclosure. This material is either of the hard pot or soft pot type, the difference being that a component potted with soft pot can be depotted in the event that its electrical characteristics are not satisfactory and correction is required. If a component is potted with hard pot it is difficult to remove the potting material without at the same time destroying or damaging the component.

A method of soft potting involves placing a soft rubber-like material, such as that available under the tradename Silgard, in the shell of a case to partially fill the case. The circuit component is then placed in the case and maintained spaced from the case bottom. A cover with an opening is placed over the top of the case shell and the edges sealed with an epoxy or similar adhesive material. Additional potting material is then inserted into the interior of the case through the opening in the cover to fill it, after which the opening is sealed. This process is expensive both in terms of potting material cost as well as labor costs since it is time consuming to properly pot the component.

The encapsulation by the potting material may degrade the quality of the circuit component since the potting material generally has a dielectric constant significantly greater than air, e.g. as high as four or five, and thus increases the leakage capacitance effects in the component. The potting material is not impervious to moisture and therefore if humidity proofing is required the circuit component must first be treated with a conformal coating, such as a polyurethene type available under the tradename Conap, to assure its watertight integrity. The potting material itself serves as an adhesive to maintain the case shell and cover together. However, the soft pot material is not sufficiently adhesive so that a further material, such as an epoxy, is required to seal the case shell and cover. While the potting material surrounds the elements of the circuit component to maintain them free from sudden movement through a dampening effect, this encapsulation becomes a disadvantage when it is desired to depot the component to correct a deficiency or for some other reason.

Enclosure of circuit components without potting was of course used prior to the development of potting techniques, and still continues in various forms. In one such device a steel metal case is provided. The pin leads of the circuit component are pushed through holes punched in another board to which the metal case cover is soldered. A copper clad layer of the printed circuit board is then seam soldered to the metal box to secure it. Such a construction is both expensive to fabricate and difficult to alter without damaging the component.

Another device utilizes a specific printed circuit board configuration in which the lead pins are positioned on the side of the board. The pins are placed in a box and act as clips to hold the component in position within the box. This device requires special pins which are on different centers from that of the modules meeting industry-wide standards and thus its use is specific and limited.

SUMMARY OF THE INVENTION

The present invention overcomes the disadvantages associated with the aforementioned potting procedures as well as those of the "potless" devices previously tried. This is accomplished, according to the invention, by providing a two-piece enclosure case uniquely capable of securely immobilizing a wide variety of standard modular circuit components. The enclosure case, which is easy to fabricate and utilize with the components, comprises two halves each of which has an essentially planar support, forming a top and a bottom, respectively, with two oppositely disposed side walls projecting therefrom. At least one half of the case has a ledge upon which the circuit component header, such as an element support board or a printed circuit board, may be supported. The other half of the case is then provided with means to urge the board against the ledge so that when the two halves are placed together the component is sandwiched between them in a secured immobile relationship. The component elements may also be advantageously spaced from the enclosure interior surfaces and thus supported free from contact with anything.

The top edges of the side walls contain interlock means which cooperate with complementary interlock means on the respective top or bottom of the other half to form a tight fitting interlock engagement. The interlock is under tension since each half has only two opposite walls which can thus be flexed. In this manner, the entire assembly unit has a continuous interlock around its periphery. Openings for the board lead pins are provided.

Since the interlock engagement can be sprung open, the component may be removed from the "potless" case for repair or replacement if found defective. This avoids the previous problems of destruction of or damage to the component in the event that it does not test out properly after enclosure for immobilization. The unique construction of the case halves also provides economy of manufacture since they may be readily molded without the need for expensive and complex molds. Since each half has only two side walls with interlocking means at their edges, the flexible side walls can be flexed for removal from the mold mechanically, such as by seizure or by means of knock out pins, without the need for multi-part molds for forming the interlock portions.

A feature of the spring tensioned interlock engagement is that once the modular circuit component is in place for use, such as on a chassis, the enclosure case cannot be sprung open since grasping the sides of the case only enhances the interlock engagement.

The lead pin openings are located along the edge of the case half having no side walls. This facilitates assembly of the circuit component therein since both the pins and openings can be readily viewed for alignment. In addition, the openings can be formed in the shape of a truncated cone with the larger diameter end of the opening on the interior side of the case into which the pins are inserted to guide them if they are slightly off-center. Advantageously, the openings can be left incomplete after forming so as to be finally punched opened when the pins are pressed therein. In this way, a standard number of openings can be provided and if no corresponding pin is present on the component no complete opening is made thus reducing the need for further sealing.

Thus, a feature of this invention is the provision of a case for enclosing modular circuit components in comparatively immobile position to reduce the likelihood of harmful effects arising from high impact, shock and vibration without the need for potting. The securing enclosure of this invention finds applicability with a wide range of circuit modules such as the two-inch by two-inch and other size modules widely used as power supplies, amplifiers, A to D converters, logarithmic amplifiers, D to A converters and the like. These may be in the form of printed circuit boards or other boards having thereon electrical and/or electronic components for a specific function. A further feature of this invention is the provision of an enclosed circuit component that is resistant to impact, shock and vibration movement.

BRIEF DESCRIPTION OF THE DRAWINGS

The foregoing advantages and features of this invention will become more apparent from the following description taken in conjunction with the accompanying drawings in which:

FIG. 1 is an exploded perspective view showing the top and bottom case halves, in relation to a modular circuit component to be enclosed therein, according to an embodiment of this invention;

FIG. 2 is a top perspective view of a complete enclosure case, having therein a modular circuit component, according to the embodiment of FIG. 1;

FIG. 3 is a sectional side view through the case of FIG. 2 taken along the line 3—3 and showing the modular circuit component immobilized therein;

FIG. 4 is a top view of the bottom case half of FIG. 1 showing the relationship of the side walls and the lead pin openings;

FIG. 5 is a cross sectional side view of the case of FIG. 2 taken along the line 5—5 showing the modular circuit component in immobilized position therein and the interlocking engagement means;

FIG. 6 is an enlarged fragmentary view of the corner of the bottom case half showing the truncated cone shaped openings assisting in the alignment of the pins therein;

DETAILED DESCRIPTION OF THE PREFERRED EMBODIMENT

Figure 7:
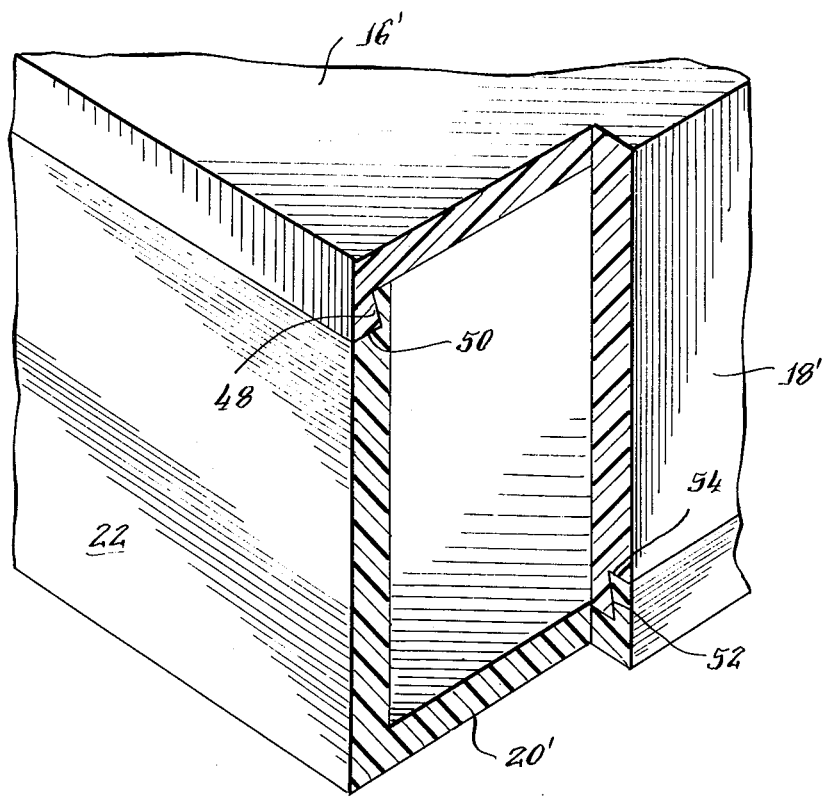
FIG. 7 is a fragmentary perspective view, partly in section, showing another form of interlocking engagement according to a further embodiment of this invention.

FIG. 1 illustrates an enclosure case and modular circuit component to be enclosed therein in exploded view showing the elements of the case and the component in relative position ready to be assembled. A fully assembled enclosure case containing the circuit module immobilized therein is shown in FIG. 2, generally referred to at 10. Referring to FIGS. 1 and 2, there is seen an enclosure case top half means 12 and a bottom half means 14. The top half means include a planar support means constituting a top 16 having two opposite side walls 18 projecting therefrom. In similar fashion, the bottom half means 14 includes a planar support means 20 forming a base or bottom having two opposite side wall means 22 projecting therefrom. As seen in FIG. 1, the top half means 12 and the bottom half means 14 are aligned for assembly with their respective side walls offset 90° from one another so that when joined together each pair of side walls on each half means is perpendicular to and cooperates with the other pair to form a complete four sided enclosure as seen in FIG. 2.

Positioned between the top half means 12 and the bottom half means 14 is the modular circuit component indicated generally at 2 which, for the purposes of illustration, is represented here by a printed circuit board 4 having pins 6 functioning as electrical leads. The modular circuit component may be either a printed circuit board or other component having a support upon which is mounted electrical and/or electronic components to perform a particular function. The enclosure case of this invention may be advantageously utilized with a wide variety of circuit modules including those functioning as power supplies, amplifiers, logarithmic amplifiers, A to D converters, D to A converters and the like. The enclosure case size may be varied to suit the module size required. If desired, the circuit component may be pretreated to provide moisture protection, for example, as by a polyurethane conformal coating as is known.

Referring again to FIG. 1, it is seen that the bottom enclosure case half means 14 includes structural means for supporting the printed circuit board 4 at its periphery to both space it and its elements from the bottom 20 and other interior surfaces and to provide the immobilization support as hereinafter described. These structural means constitute ledges 24 formed in the side walls 22 due to an undercut region 26 which also forms a lip 28 at the top edges of the bottom side walls 22. The ledges 24 advantageously provide support for that peripheral edge of the board 4 on which there are no pins 6. Additional support and spacing may be provided at other locations, such as along the edge containing the pins 6, by upstanding projections, such as at 30, projecting from the base 20. The base 20 also contains openings 32 for passage of the pins 6 therethrough to permit electrical contact with the component and enable plugging it in to a circuit.

As seen in FIGS. 1 and 5, the top side walls 18 each contain a bevelled flange or lip 40 the purpose of which is to function as a catch for interlocking engagement with the base 20 explained in detail below. Also shown in FIGS. 1 and 5 is a bevelled undercut portion 42 on each edge of the base 20 perpendicular to the side walls 22. The bevelled lips 40 and the bevelled undercut edges 42 are complementary and cooperate to form an interlock when the case halves are joined together. Similarly, the case half top 16 has bevelled edges 44 which is complementary to the bevelled lips 28 of the bottom side walls 22 and cooperates therewith to form an interlocking engagement, as seen in FIG. 3, when the case halves are joined together. Also seen in FIG. 3 are flanges 46 which project downwardly from the case half top 16 along the edges perpendicular to the top side walls 18. These flanges cooperate with the ledges 24 to form a clamp which sandwiches the board 4 therebetween to immobilize it in a secure tight fitting relationship.

The side walls 18 and 22 should be sufficiently resilient and flexible to be spring-like so that the lips 28 and 40 function as catches with the bevelled edges of the other case half planar support means to provide tight interlocking engagement. Thus, since the lips project inwardly a degree greater than the outer dimension of the bevelled edges and the board 4, the side walls must flex when assembling the case halves to permit the lips to pass over the board and over the edges. This is permitted according to the construction shown since only two opposite side walls are provided on each case half permitting them to flex in a plane parallel to the side walls and perpendicular to the planar support means. The material of construction should be one which permits this flexing yet maintains the side walls under tension for tight interlocking engagement due to the flexed walls seeking to return to their normal position. Many types of plastic materials are suitable provided that they are not too soft or spongy. Soft materials may be used but in that case it may be necessary to provide strengthening ribs and/or bosses to keep the enclosure case from being too flexible. In the embodiment shown in FIGS. 1 through 6, interlocking engagement means are provided for both sets of side wall and support means so that the assembled enclosure case has a continuous interlock about its periphery. However, it may be advantageous in some applications to provide interlock means only at selected portions, as, for example, along only one set of side walls.

The structure of the enclosure case halves provides economies of manufacture in that the case halves may be molded of plastic without the need for expensive multi-part molds to provide the undercut portions forming the lips 28 and 40. This is possible because the side wall means are flexible as described and may be removed from the mold mechanically. The mode of interlocking engagement is also advantageous once the enclosed module is in place on a chassis since grasping the side walls to remove the module causes an inward force which only enhances the security of the interlock engagement. However, once the enclosure box and component are removed from the chassis the side walls can be fixed to open the enclosure and remove the circuit module if desired.

Althugh the flanges 46 and ledges 24 serve to clamp the modular circuit component securely in place and immobilize it, additional assurance of immobilization is provided by means of the restriction to movement resulting from placing the pins in the openings 32. The openings 32 are illustrated best in FIG. 6 where it can be seen that the openings may be in the form of a truncated cone so that the diameter of the opening communicating with the interior of the case, at 34, is greater than the diameter at the case exterior, at 36, resulting in a cone shape and bevelled edges. This facilitates assembly of the component within the case half since the bevelled edges provide a guide for the pins in the event that they are not precisely aligned with the opening 32 as shown in FIG. 6 with respect to the misaligned pin shown in phantom. In addition a small amount of material, as shown at 38, which may constitute flashing from a molding process, may remain on the opening to be punched out by the pins 6 when inserted. This provides an added advantage of avoiding the need for sealing openings in the case half for which corresponding pins 6 do not exist on a particular circuit module.

The modular circuit component in the enclosure case can be utilized as is or the case may have its edges sealed by epoxy if desired. In addition, the case can incorporate necessary safeguards for specific circuit components. Insulation may be provided for thermal protection for those applications requiring it. The case may also incorporate shielding, grounding or mechanical inserts for other special requirements. Generally, however, it has been found that a case of plastic material having a dielectric constant maximum of 3–5 at $10^6$ HZ and resistant to temperatures ranging from $-65°$ C to $+140°$ C is suitable for a wide variety of applications.

Figure 8:
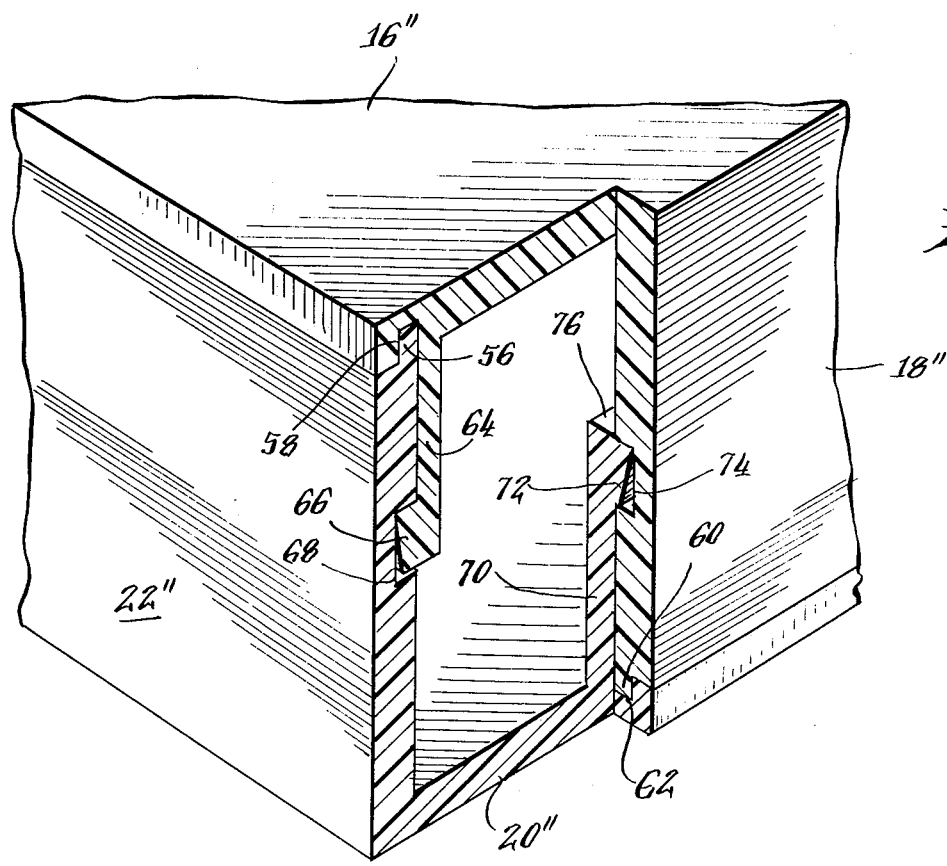
FIG. 8 is a fragmentary perspective view, partly in section, showing another form of interlocking engagement according to yet a further embodiment of this invention.

Other means for providing mechanical interlock engagement may be provided as illustrated in FIGS. 7 and 8. In FIG. 7, wherein like primed numbers refer to the same elements as in FIGS. 1 through 6, the interlock means is shown as comprising bevelled undercut lips 48 on the top 16' which cooperate with undercut portions 50 formed in the side walls 22' of the bottom 14'. The flexibility of the side walls are utilized to provide the springing interlock engagement. Similarly, lips 52 are provided on the base 20' and undercut portions complementary thereto are provided on the side walls 18' as shown at 54. Thus, a partial dovetail interlock is obtained. In this embodiment, no lips or flanges protrude into the interior space of the enclosure case so that it may find particular suitability and applicability where it is not desired to pass a lip over the support board of the circuit component. It will be understood that the embodiment of FIG. 7 may be provided with interior supports or ledge means and cooperating clamping flanges as previously described for clamping immobilization, in sandwich-like fashion, of the component therein.

FIG. 8 shows another embodiment of interlocking means wherein the side wall edges of one half engage the planar support means of the other half in rabbet-like fashion. As seen in FIG. 8, where double primed numbers identify like elements previously described, the bottom side walls 22" contain tongues 56 at their upper edges which engage the grooves 58 of the top 16". Similarly, the tongues 60 of the top side walls 18" engage the grooves 62 of the bottom 20" to provide a joint. Secure interlocking of the case halves is provided by projections on the flange means 64 extending from the case halves tops and bottoms. Thus, the flanges 64 project downward from the case half top 16" perpendicular to the side walls 18" parallel to the side walls 22" of the bottom half, when joined together, and carry projections 66 at their ends which engage the recesses 68 in the side walls 22". Similarly, the bottom 20" has upstanding flanges 70 perpendicular to the side walls 22" and parallel to the side walls 18", when joined together. These flanges 70 have projections 72 at their ends which project into the recesses 74 of the top side walls 18" to provide tight interengagement.

The flange means 64 and 70 are resilient and spring-like as previously described so that tight interengagement is provided. This embodiment permits secure engagement since flange means 64 and 70 and their respective projections 68 and 72 press outward against the side walls 22″ and 18″ whereas the tongue and groove joints resist this outward movement and overall tight secure engagement is obtained. The flange means 64 and 70 will be resilient provided they are not joined to the side wall means and thus may be flexed in a plane perpendicular to the top and bottom and parallel to the flange means. Alternatively, they may join the side walls and thus secure engagement provided from the projection and recess interlock means.

It will be understood that the case closure of FIG. 8 may contain internal means for supporting the modular circuit component in immobilization therein, as has been previously described. For example, the top of flanges 70 may have surfaces 76 which support the edge of a board such as 4 whereas the bottom of the flanges 64 may have surfaces 78 which press against the board top so that between these surfaces 76 and 78 there is a clamp-like sandwiching of the component therein.

While there have been disclosed preferred circuit component enclosure cases having cooperating interlock means on each case half, it is contemplated that for some applications other means resulting in tight-fitting secure engagement of the case halves may be utilized. Thus, the case halves may be joined in tight engagement by other locking or fastening means or for certain applications by suitably arranged frictional engagement provided it is arranged to be capable of achieving the requisite security.

I claim:

1. An enclosed modular circuit component substantially immobilized for resistance to potentially harmful effects due to impact, shock and vibration movements without encapsulation in potting material comprising:
   a first case-half means having a support means and two oppositely disposed side wall means projecting from the support means,
   a second case-half means having support means and two oppositely disposed side wall means projecting from the support means,
   the side wall means of at least one of the case halves having mechanical interlock means,
   the other of the case halves having mechanical interlock means on its support means,
   a modular circuit component positioned between the case halves,
   the case halves being assembled together juxtaposed with the side wall means of one case half perpendicular to the side wall means of the other case half to form a complete enclosure,
   the interlock means on the side wall means and on the support means cooperating with one another forming the tight fitting secure engagement,
   at least one case half side wall means being sufficiently flexible in a spring-like manner relative to a plane substantially perpendicular to the other case half support means so that the secure engagement is aided by tension forces,
   ledge means formed on the interior of the side wall means of at least one of the case halves supporting at least part of the component thereon,
   the case half not having the ledge means including interior projection means contacting at least a part of the component therein,
   the ledge means and projection means forming clamp-like surfaces securely contacting the component therebetween
   holding the circuit component immobilized therein essentially free from movement due to impact, shock, vibration and the like under use.

2. An enclosed modular circuit component as claimed in claim 1 wherein the mechanical interlock means are present on all side wall means and on the complementary support means providing a continuous interlock around the entire periphery of the complete case formed by the halves joined in interlocking engagement.

3. A case enclosing modular circuit components to reduce the likelihood of harmful effects due to impact, shock and vibration movements without the need for potting thereof comprising:
   a first case-half means and a second case-half means assembled together,
   the first case-half means having a support means and two oppositely disposed side wall means projecting from the support means,
   the second case-half means having a support means and two oppositely disposed side wall means projecting from the support means,
   the side walls of at least one of the case halves having mechanical interlock means,
   the other of the case halves having mechanical interlock means on its support means,
   the interlock means on the side wall means and on the support means cooperating with one another in tight fitting secure engagement
   when the case halves are assembled juxtaposed with the side wall means of one case half perpendicular to the side wall means of the other case half to form a complete enclosure,
   at least one case half side wall means being sufficiently flexible in a spring-like manner relative to a plane substantially perpendicular to the other case half support means so that secure engagement is aided by tension forces,
   ledge means formed on the interior of the side wall means of at least one of the case halves supporting at least part of the component thereon,
   the case half not having the ledge means including interior projection means contacting at least part of the component,
   the ledge means and projection means forming clamp-like surfaces securely contacting the component therebetween
   securely holding the component immobilized essentially free from movement due to impact, shock, vibration and the like under use.

4. A case as claimed in claim 3 wherein the mechanical interlock means are present on all side wall means and on the complementary support means providing a continuous interlock around the entire periphery of the complete case.

5. A case as claimed in claim 3 wherein the mechanical interlock means on the side wall means comprises an inwardly projecting bevelled lip at the upper edge of the side wall means and the mechanical interlock means on the case half support means comprises a bevelled edge on the support means edges not carrying the side wall means, the edge being bevelled so that the support means outer surface has a lesser periphery than its inner surface whereby the lip means snaps over the bevelled edge which projects into an undercut region below the lip to form tight interengagement.

6. A case as claimed in claim 3 wherein the mechanical interlock means on the side wall means comprises an undercut portion at the upper interior edge of the side wall and the mechanical interlock means on the case half support means comprises a complementary shaped undercut portion forming an inwardly projecting lip which engages the side wall undercut portion to form a secure interlock.

7. A case as claimed in claim 3 wherein the interlock means on the side walls comprises a recess extending across the width of the interior of each side wall and spaced from the support means, the interlock means projecting from the support means comprises flanges projecting from the support means along the edge of the support means perpendicular to the side wall means projecting therefrom and projecting means extending from the flange means outwardly from the case interior, and the projecting means and the recess means are complementary aligned with the projection means engaging the recess forming a secure interlock.

8. A case as claimed in claim 7 wherein the ledge means are formed by the top surface of the flange means.

9. A case as claimed in claim 8 wherein the mechanical interlock means are present on all side wall means and on the complementary support means providing a continuous interlock around the entire periphery of the complete case, and the flange means surfaces of the respective halves clamping at least part of the component between them in a sandwich-like manner maintaining it essentially immobile therein

* * * * *